US006798259B2

(12) United States Patent
Lin

(10) Patent No.: US 6,798,259 B2
(45) Date of Patent: Sep. 28, 2004

(54) SYSTEM AND METHOD TO IMPROVE THE EFFICIENCY OF SYNCHRONOUS MIRROR DELAYS AND DELAY LOCKED LOOPS

(75) Inventor: Feng Lin, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/921,614

(22) Filed: Aug. 3, 2001

(65) Prior Publication Data

US 2003/0034815 A1 Feb. 20, 2003

(51) Int. Cl.$^7$ .................................................. H03L 7/00
(52) U.S. Cl. ........................ 327/153; 327/299; 365/233
(58) Field of Search ................................ 327/146, 147, 327/149–156, 158–162, 291, 295–298, 165; 375/376; 365/233, 233.5, 194; 331/1 A, DIG. 2

(56) References Cited

U.S. PATENT DOCUMENTS

| 5,771,264 | A | * | 6/1998 | Lane | 375/376 |
| 5,940,608 | A | | 8/1999 | Manning | 713/503 |
| 6,018,259 | A | * | 1/2000 | Lee | 327/159 |
| 6,069,506 | A | | 5/2000 | Miller, Jr. et al. | 327/156 |
| 6,128,248 | A | | 10/2000 | Idei et al. | 365/233 |
| 6,166,990 | A | * | 12/2000 | Ooishi et al. | 365/233 |
| 6,205,086 | B1 | | 3/2001 | Hanzawa et al. | 365/233 |
| 6,373,913 | B1 | * | 4/2002 | Lee | 375/376 |

* cited by examiner

Primary Examiner—Minh Nguyen
(74) Attorney, Agent, or Firm—Whyte Hirschboeck Dudek SC

(57) ABSTRACT

A phase detection system and method for use with a synchronous mirror delay ("SMD") or a delay-locked loop ("DLL") reduces the number of delay stages required and increases efficiency. The invention takes a clock input signal and clock delay or feedback signal, each having timing characteristics, and differentiates between four conditions based upon timing characteristics of the signals. The phase detector and associated circuitry determines, based upon timing characteristics of the signals, which phase conditions the signals are in. Selectors select the signals to be introduced into the SMD or DLL by the timing characteristics of the phase conditions. The invention utilizes the falling clock edge of the clock input signal and decreases the lock time under specific phase conditions. The invention increases efficiency of the circuits by reducing the effective delay stages in the SMD or DLL while maintaining the operating range.

28 Claims, 10 Drawing Sheets

FIG. 5

| | PH1 (32) | PH2 (34) | CONDITIONS | |
|---|---|---|---|---|
| (1) | 0 | 0 | $t_{ck} - t_{mdl}$ | ($t_{mdl} > \frac{t_{ck}}{2}$) |
| (2) | 1 | 1 | $\frac{t_{ck}}{2} - t_{mdl}$ | ($t_{mdl} < \frac{t_{ck}}{2}$) |
| (3) | 1 | 0 | $t_{mdl} = t_{ck}$ | (LOCKED) |
| (4) | 0 | 1 | $t_{mdl} = \frac{t_{ck}}{2}$ | (LOCKED) |

SYSTEM AND METHOD TO IMPROVE THE EFFICIENCY OF SYNCHRONOUS MIRROR DELAYS AND DELAY LOCKED LOOPS

BACKGROUND OF THE INVENTION

The present invention relates generally to the field of integrated circuits. More particularly, the invention relates to circuits that will synchronize the internal timing or clock signals within an integrated circuit such as a synchronous dynamic random access memory (SDRAM) to external timing or clock signals.

Most digital logic implemented on integrated circuits is clocked synchronous sequential logic. In electronic devices such as synchronous dynamic random access memory circuits (SDRAMs), microprocessors, digital signal processors, and so forth, the processing, storage, and retrieval of information is coordinated with a clock signal. The speed and stability of the clock signal determines to a large extent the data rate at which a circuit can function. Many high-speed integrated circuit devices, such as SDRAMs, microprocessors, etc., rely upon clock signals to control the flow of commands, data, addresses, etc., into, through and out of the devices.

A continual demand exists for devices with higher data rates; consequently, circuit designers have begun to focus on ways to increase the frequency of the clock signal. In SDRAMs, it is desirable to have the data output from the memory synchronized with the system clock that also serves the microprocessor. The delay between a rising edge of the system clock (external to the SDRAM) and the appearance of valid data at the output of the memory circuit is known as the clock access time of the memory. A goal of memory circuit designers is to minimize clock access time as well as to increase clock frequency.

One of the obstacles to reducing clock access time has been clock skew, that is, the delay time between the externally supplied system clock signal and the signal that is routed to the memory's output circuitry. An external system clock is generally received with an input buffer and then further shaped and redriven to the internal circuitry by an internal buffer. The time delay of the input buffer and the internal buffer will skew the internal clock from the external clock. This clock skew will cause signals that are to be transferred from the integrated circuit to be out of synchronization with the external system clock. This skew in the clock signal internal to the integrated circuit is furthered by the delays incurred in the signal passing through the clock input buffer and driver and through any associated resistive-capacitive circuit elements. One solution to the problem of clock skew is the use of a synchronous mirror delay, and another is the use of delay-locked loops.

Delay-locked loops (DLL) are feedback circuits used for synchronizing an external clock and an internal clock with each other. Typically, a DLL operates to feed back a phase difference-related signal to control a delay line, until the timing of one clock signal is advanced or delayed until its rising edge is coincident with the rising edge of a second clock signal.

A synchronous mirror delay circuit (SMD) is a circuit for synchronizing an external clock and an internal clock with each other. The SMD can acquire lock generally within two clock cycles. The SMD has a period of delay, known as a delay range. The delay range of the SMD determines the actual operating range, or clock frequency, within which the integrated circuits (ICs) can operate. In other words, it is desired to reduce the number of delay stages required in the SMD while maintaining the lock delay range. One goal is to improve the efficiency of the SMD to maintain the proper operating range and to reduce the required area and power consumption of the SMD.

For the conventional SMD implementations, two delay lines are required, one for delay measurement, one for variable mirrored delay. The effective delay length for both delay lines is defined as:

$$t_{delay} = t_{ck} - t_{mdl}$$

where $t_{ck}$ is the clock period, $t_{mdl}$ is the delay of an input/output ("I/O") model, including clock input buffer, receiver, clock tree and driver logic. The delay stages required for each delay line is given by:

$$N = \frac{t_{delay}}{t_d} = \frac{t_{ck} - t_{mdl}}{t_d}$$

where $t_d$ is the delay per stage. The worst case number is given by:

$$N_{worst} = \frac{t_{ck}(\text{long}) - t_{mdl}(\text{fast})}{t_d(\text{fast})}$$

For example, where $t_{ck}$ (long)=15 ns (as in a 66 MHz bus), $t_{mdl}$ (fast)=1 ns and $t_d$ (fast)=110 ps, $$N_{worst} = \frac{15 \text{ ns} - 1 \text{ ns}}{110 \text{ ps}} \approx 128$$

For two delay lines in an SMD, a total of 256 stages are needed to adjust the delay.

When locking, $t_{lock} = d_{in} + t_{mdl} + (t_{ck} - t_{mdl})$ (measured) $+ (t_{ck} - t_{mdl})$ (variable) $+ d_{out}$. This is the conventional equation to calculate the lock time of the SMD, which is generally two clock cycles, based on sampling from one rising edge to the next rising edge of the internal clock signal.

Therefore, one goal of the present invention is to reduce the effective delay stages used in the SMD while maintaining the lock range.

SUMMARY OF THE INVENTION

The present invention solves the aforementioned problems, and improves the efficiency of the synchronous circuitry for the internal clock signal to lock with the external clock signal.

In one aspect of the invention, a phase detection and selection circuit includes a phase detector for receiving a clock input signal CIN and a clock delay signal CDLY. Each signal has is timing conditions and generates a plurality of output signal combinations, each combination corresponding to pre-defined phases of the signals based upon the timing characteristics. Logic is associated with the phase detector to select one of the output signal combinations corresponding to the timing conditions of the signals. The timing characteristics define a period of CIN as $t_{ck}$ and also define a period from a rising edge in CIN to a rising edge in CDLY as $t_{mdl}$, and wherein when $t_{mdl} > t_{ck}/2$, CIN is input into the SMD, and when $t_{mdl} < t_{ck}/2$, an inverted clock signal CIN' is input into the SMD to reduce the number of delay stages in the SMD.

In another aspect of the invention, a method of improving the efficiency of a synchronous mirror delay circuit comprises the steps of providing a clock input signal CIN, an inverted clock signal (CIN') and a clock delay signal CDLY, each having timed characteristics. The method includes interposing a phase detector and selection system between an external clock signal and a synchronous mirror delay circuit, and determining which of a number of phases the signals are in based on the timing characteristics, and directing the signals based upon the phase of the signals.

In another aspect of the invention, a phase detection and selection circuit for a delay-locked loop (DLL) includes a phase detector for receiving a clock input signal CIN and a clock feedback signal CKFB. Each signal has timing conditions and generates a plurality of output signal combinations, each combination corresponding to pre-defined phases of the signals based upon the timing characteristics. Logic is associated with the phase detector to select one of the output signal combinations corresponding to the timing conditions of the signals. The timing characteristics define a period of CIN as $t_{ck}$ and also define a period from a rising edge in CIN to a rising edge in CKFB as $t_e$, and wherein when $t_e < t_{ck}/2$, the effective delay of the DLL is less than $t_{ck}/2$.

BRIEF DESCRIPTION OF THE DRAWINGS

The drawings illustrate the best mode presently contemplated for carrying out the invention.

In the drawings:

FIG. 5 is a chart illustrating the logic combinations of the signals in FIG. 2 based upon the timing characteristics of FIGS. 3 and 4.

DETAILED DESCRIPTION OF THE PREFERRED EMBODIMENT

Figure 1:
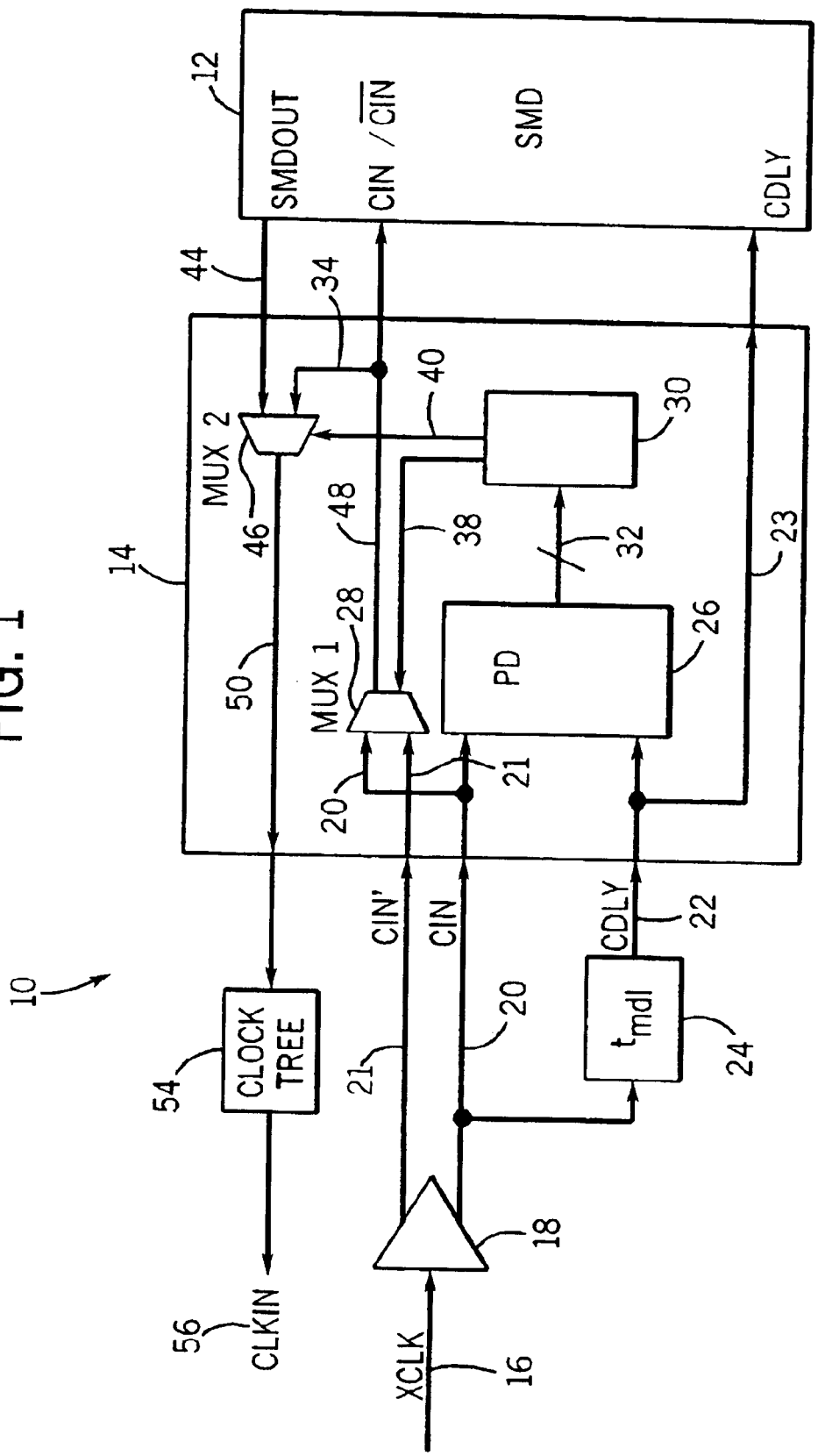
FIG. 1 is a block diagram of a synchronous mirror delay with phase detection in accordance with the present invention.

Referring now to FIG. 1, a system in accordance with the present invention is shown generally by the numeral 10. The system 10 includes a synchronous mirror delay (SMD) circuit 12 and a phase detector control block 14. An external clock signal 16 is input into receiver and buffer 18. This produces clock input signal 20 (CIN), inverted clock input signal (CIN') 21 and clock delay signal 22 (CDLY). Clock delay signal 22 is delayed by an system delay $t_{md1}$ illustrated by block 24. CDLY 22 is also directly fed via line 23 into the SMD 12.

Figure 2:
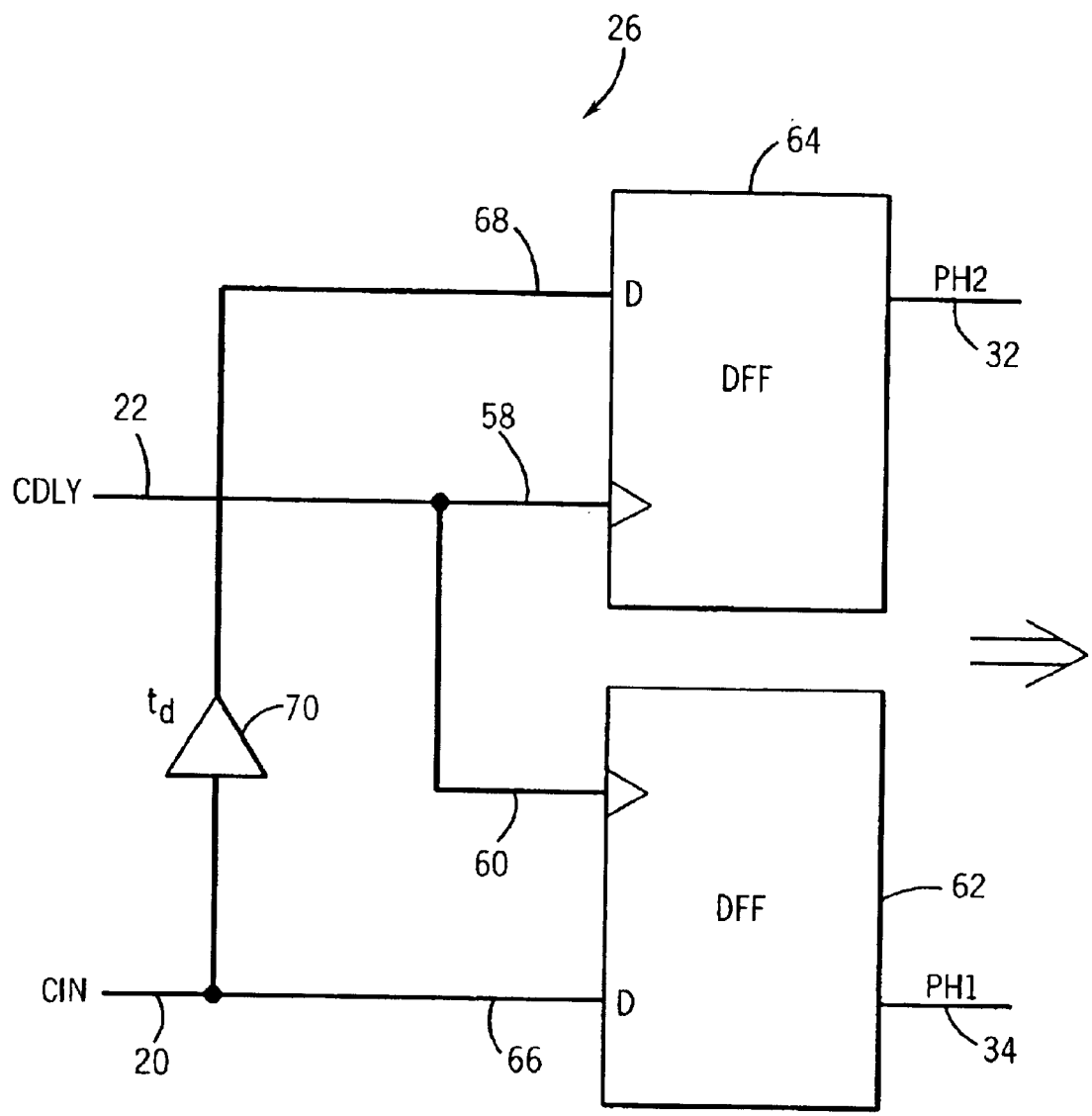
FIG. 2 is a circuit diagram illustrating the phase detector in accordance with one aspect of the present invention.

Phase detector control block 14 includes phase detector 26 and associated logical circuitry. The goal of the present invention is to take clock input signal 20 and clock delay signal 22 and, by defining certain characteristics and relationships about the timing of the signals, delineate specific conditions under which the circuit is operating, and direct the signal accordingly. Ultimately, the phase of the signals will determine whether CIN' 20 or CIN' 21 is used as the input to the SMD, or whether the SMD is bypassed altogether. Although a specific logic arrangement is shown, it is contemplated that any suitable control logic may be used to define the conditions of the signals and select them accordingly. Associated with the phase detector is a multiplexor 28 which is used as an input selection multiplexor, that is to determine which selection input (CIN or CIN'), based on the difference between CIN signal 20 and CDLY signal 22, to send to the SMD 12. The outputs (collectively 32) of phase detector 26, which will be described in further detail with respect to FIG. 2 is fed into circuitry control block 30. Circuitry block 30 may be, for instance, a decoder, although any suitable logic is contemplated. The outputs 38 and 40 of phase detection circuitry block 30 will be used to select the outputs for multiplexors 28 and 46, respectively. Based on the signal 38 from control circuitry block 30, input multiplexor 28 will select either CIN 20 or CIN' 21 to be placed on line 48. The output multiplexor 46 is used in combination with the control circuitry block 30 to select which signal is to be put on output line 50. Line 48 (either CIN signal 20 or CIN' signal 21) is directed into the SMD 12. Line 48 is also directed via connection 34 to an input of output selection multiplexor 46. As is known in the art, the SMD 12 includes a measurement delay line composed of a plurality of serially cascaded delay elements (not shown), the measurement delay line having a measurement delay line input and a measurement delay line output. Each delay stage is a delay element with control gates. An output of the measurement delay line is used as the input to a variable delay line. The variable delay line is also a plurality of serially connected delay elements (not shown), the variable delay line having a variable delay line input and a variable delay line output. The output of the variable delay line of the SMD 12 is output signal SMDOUT 44. Output signal SMDOUT 44 is used as the input to output multiplexor 46. In some circumstances, it is desired to entirely bypass SMD 12, and in such a case, control circuitry block 30 will send a control signal 40 selecting line 34 rather than SMDOUT 44 as the output 50 of output selection multiplexor 46. As a result, line 48 (either CIN signal 20 or CIN' signal 21) will be used as the input for output selection multiplexor 46. In other cases, the control circuitry block 30 will send a control signal 40 selecting signal SMDOUT 44 from SMD 12. Having selected one of the signals 34 or signal SMDOUT 44, output signal 50 is used as the input to clock tree 54. As is known, a clock tree is a circuit used for distributing a local clock signal. A clock tree may include an internal buffer in order to amplify, buffer and delay the signal in order to form internal clock signal CLKIN 56. Although not shown, it is contemplated that an inverter may be placed before the clock tree 54 in order to invert the clock signal if desired. In this manner, internal clock signal CLKIN 56 will be matched to the external clock 16.

Referring now to FIG. 2, phase detector 26 is described in more detail. Phase detector 26 receives clock input signal 20 and clock delay signal 22. Clock delay signal 22 is used as clock inputs 58 and 60 into registers 64 and 62 respectively. Although D flip-flops are used as registers 62 and 64, it is contemplated that any suitable logic device suitable for the application may be employed. Signal 22 is input into the clock inputs for the D flip-flops. Clock input signal CIN 20 is input as the D inputs 66 and 68 of flip-flops 62 and 64, respectively. Input 68 is delayed from clock input signal 20 by $t_d$ 70, which is representative of the delay per stage, and therefore there is a delay between input signals 66 and 68, by a period $t_d$ 70. Each flip-flop 62 and 64 respectively outputs a signal 34 and 32. The logical level, i.e., a logical 1 or a logical 0, of signal branches 32 and 34 determine the condition under which the relationship of the CIN signal 20 and CDLY signal 22 are operating in. The signal conditions are based on their individual timing characteristics.

Figure 3:
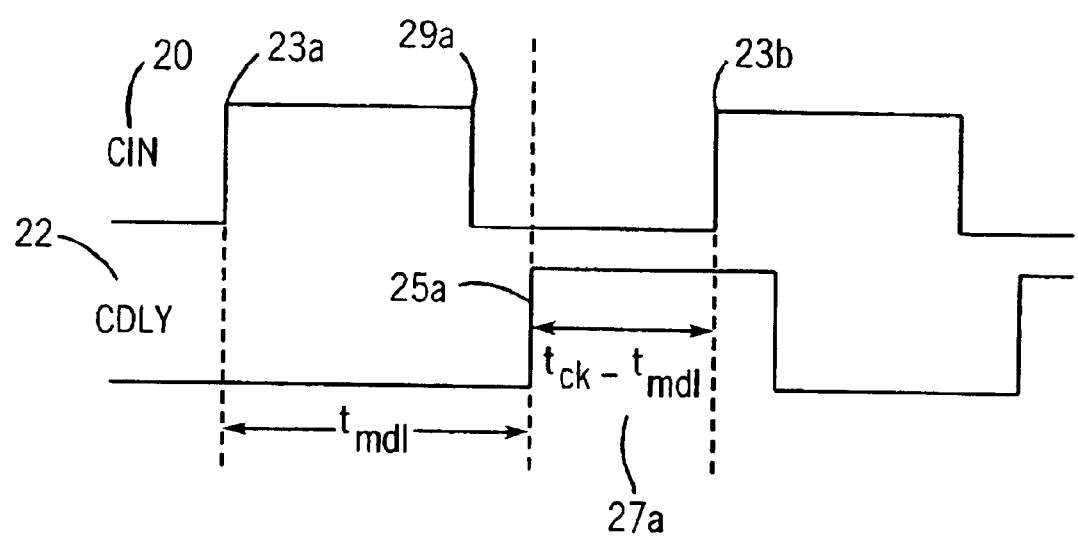
FIG. 3 is a signal timing diagram showing the timing of a clock input signal and a clock delay signal in accordance with one aspect of the present invention.

Referring now to FIG. 3, a clock diagram is shown illustrating one possible combination of timing characteristics of CIN signal 20 and CDLY signal 22. CIN signal 20 fires first, and the characteristic $t_{mdl}$, which is the delay of the I/O model, is measured from the rising edge 23A to the rising edge 25A of CDLY signal 22. The entire period of CIN signal 20, that is the measurement of rising edge 23A to the next rising edge 23B is defined as the clock period or $t_{ck}$. Therefore, the time defined from the rising edge 25A of CDLY signal 22 to the next rising edge 23B of the CIN signal 20 defines a delay, $t_{delay}$ 27A, which may be defined by $t_{ck}$ minus $t_{mdl}$. This series of timing characteristics would occur when CDLY signal 22 fires after the first falling edge 29A of CIN signal 20. This sampling of CIN from rising edge to rising edge requires a given number of delay stages to accomplish, where the total delay of these delay stages is $t_{delay}$, which is less than half of $t_{ck}$.

Figure 4:
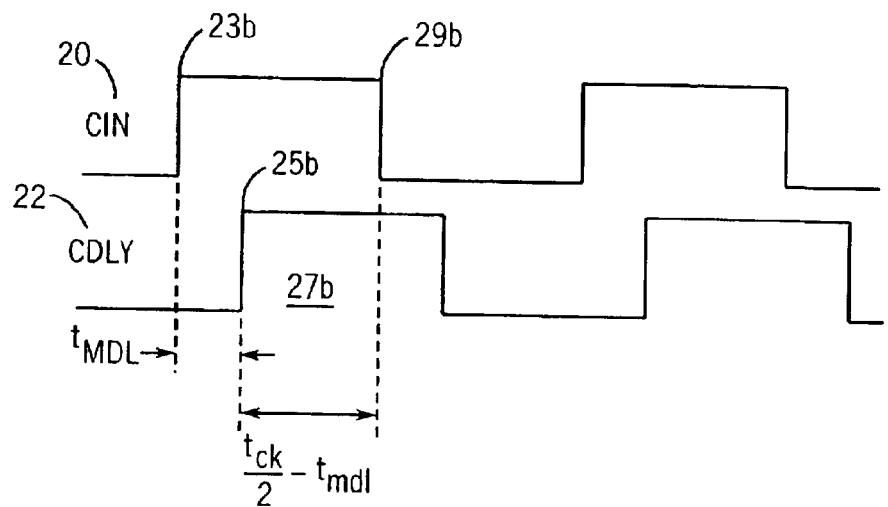
FIG. 4 is a signal timing diagram showing the timing of a clock input signal and a clock delay signal in accordance with one aspect of the present invention.

Referring now to FIG. 4, an alternate timing diagram is shown for CIN signal 20 and CDLY signal 22. These timing characteristics would occur when the rising edge 25B of CDLY signal 22 occurred prior to the falling edge 29B of CIN signal 20. Again, the delay between the firing at the rising edge 23B of CIN signal 20 and rising edge 25B defines the period of delay for the I/O model $t_{mdl}$. Because the period of time from rising edge 23B to falling edge 29B represents half of the clock period $t_{ck}$, that portion of the signal may be represented by $t_{ck}/2$. Therefore, that distance minus the delay period for the I/O model $t_{mdl}$ results in the delay period 27B, in this case defined as $t_{ck}/2$ minus $t_{mdl}$. Therefore, if the phase detector analyzes when the rising edge of CDLY signal 22 occurs with respect to the falling edge of CIN signal 20, a distinction can be made with respect to the timing characteristics of the individual signals 20 and 22. Since the total delay required from the SMD for synchronization is reduced from ($t_{ck}$ minus $t_{mdl}$) to ($t_{ck}/2$ minus $t_{mdl}$) where $t_{mdl}$ is less than $t_{ck}/2$, more than half of the delay stages can be saved with this invention. The present invention takes advantage of the ability to sample from a rising edge 23b to falling edge 29b, resulting in fewer delay stages in the SMD to accomplish.

Figure 4A:
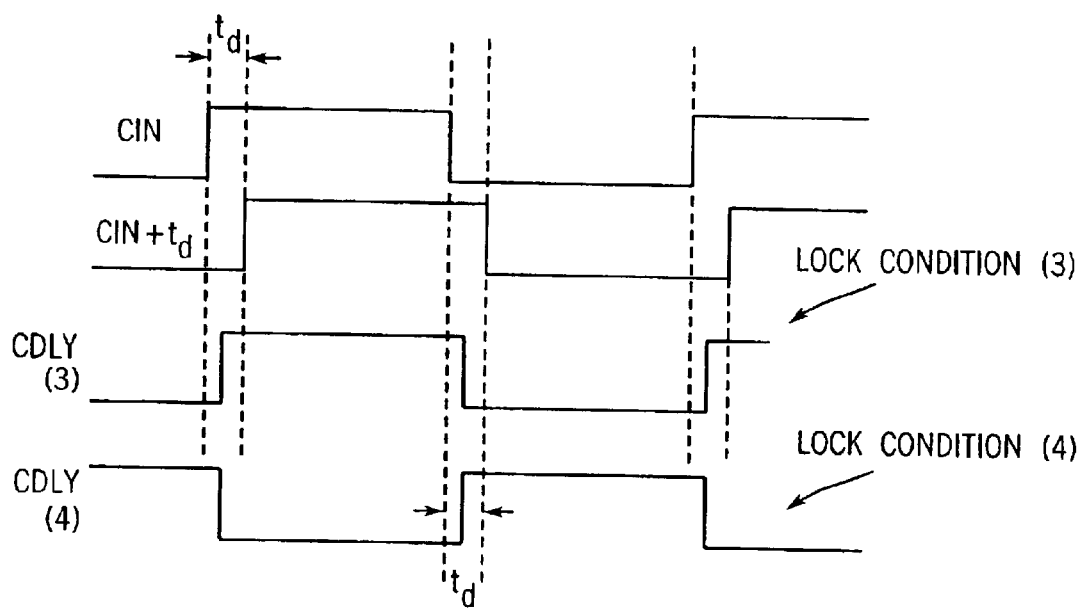
FIG. 4a is a signal timing diagram showing the timing of a clock input signal and a clock delay signal under lock conditions in accordance with one aspect of the present invention.

Referring now to FIG. 4a, the timing diagram is shown illustrating the lock conditions. CIN signal is shown as well as CIN plus $t_d$, where $t_d$ represents the delay between the two signals. In lock condition 3, signal CDLY is shown rising between the rising of CIN and CIN plus $t_d$, and falling between the falling of CIN and CIN plus $t_d$, respectively. Under this circumstance, a lock condition exists and the synchronous mirror delay is bypassed. Under lock condition 4, CDLY signal rises between the falling edge of CIN and the falling edge of CIN plus $t_d$. And CDLY falls between the rising edge of CIN and the rising edge of CIN plus $t_d$. Again, a lock condition exists and again the synchronous mirror delay is bypassed.

Referring now to FIG. 5, the four possible combinations of the logical levels of PH1 signal 32 and PH2 signal 34 are illustrated. Based on the logical levels of each of these signals, the condition of the signals may be determined from the logic levels on these lines.

Condition (1):

$$t_{mdl} > t_{ck}/2$$

For condition (1), the effective delay length in the SMD is equal to $t_{ck} - t_{mdl}$. When locking, $t_{lock} = d_{in} + t_{mdl} + (t_{ck} - t_{mdl})$ (measured) $+ (t_{ck} - t_{mdl})$ (variable) $+ d_{out} = 2t_{ck} + d_{in} + d_{out} - t_{mdl} \approx 2t_{ck}$, where $d_{in}$ and $d_{out}$ are I/O intrinsic delays on which $t_{mdl}$ is represented or modeled.

This is the conventional equation to calculate the lock time of the SMD, which is two clock cycles.

Condition (2):

$$t_{mdl} < t_{ck}/2$$

Under this condition, a multiplexor is used to select a different phase of CIN to feed in the SMD and the effective delay length is equal to $t_{ck}/2 - t_{mdl}$.

Again, $t_{lock} = d_{in} + t_{mdl} + (t_{ck}/2 - t_{mdl}) + (t_{ck}/2 - t_{mdl}) + d_{out} = t_{ck} + d_{in} + d_{out} - t_{mdl} \approx t_{ck}$.

The lock time is decreased to only one clock cycle. From the previous example, $$N_{worst} = \frac{15 \text{ ns}/2 - 1 \text{ ns}}{110 \text{ ps}} = 59 \text{ stages}$$

compared to 128 stages without the invention.

Condition (3):

When $t_{mdl} = t_{ck}$, the PD would declare a lock condition and the clock signal CIN is output directly without even passing into the SMD. The SMD may be disabled to save power.

Condition (4):

When $t_{mdl} = t_{ck}/2$, the CIN is inverted and the SMD may be disabled to save power.

It is contemplated that the present invention will reduce the effective delay elements used in the SMD, as a function of the signals being found under the condition 2, saving both silicon area and power in the memory device, which is the primary goal.

For conditions (2) and (4), if there is a severe duty cycle distortion, the falling edges of CIN cannot provide a correct reference to adjust the delay, which would result in a large skew (phase error) at the output.

Figure 6:
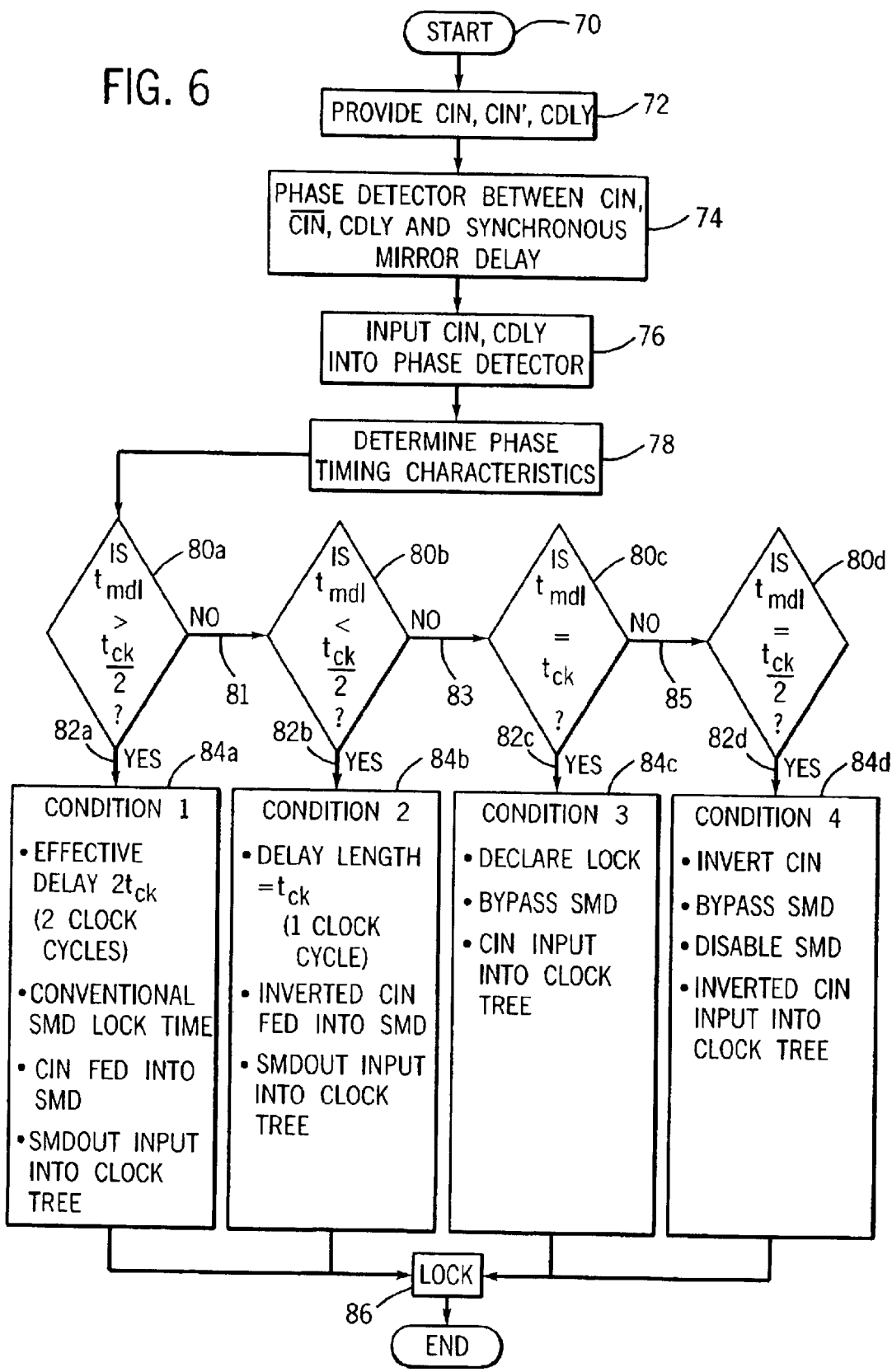
FIG. 6 is a flowchart illustrating a method in accordance with one aspect of the present invention.

Referring now to FIG. 6, a flowchart illustrating a methodology associated with the present invention is disclosed. At the start 70, the present invention is used for those circuits in which it is desired to reduce the number of delay stages and there is negligible duty-cycle distortion. Therefore, signal CIN, inverted CIN and CDLY are provided in step 72. CDLY is delayed by the delay of the I/O system. In step 74, a phase detector is interposed between the synchronous mirror delay and CIN and CDLY signals. Both CIN and CDLY are input into the phase detector 76, after which it is necessary to determine based on the timing characteristics and relationships of CIN to CDLY, which condition or phase the timing signals are in 78. This leads to a series of four decisions 80a through 80d used to determine the relationship of the particular timing characteristics $t_{mdl}$ versus $t_{ck}$.

Although the series of decisions are shown made in a serial fashion, that is, 80a prior to 80b and so on, these operations could also be rearranged to run in other serial fashions or in parallel, so long as the determinations are made. In decision 80a it is determined whether $t_{mdl}$ is greater than $t_{ck}/2$ but less than $t_{ck}$. If so, 82a condition 1 is triggered 84a in which the lock time is equal to two clock cycles, which is the conventional synchronous mirror delay lock time. In a conventional manner, CIN is then fed into the synchronous mirror delay. The SMDOUT signal is input into the clock tree. If condition 1 is not satisfied 81, it is determined whether $t_{mdl}$ is less than $t_{ck}/2$ in decision 80b. If so 82b, condition 2 is implicated in which the lock time is equal to approximately one clock cycle, or approximately half of the conventional synchronous mirror delay lock time. CIN is then inverted and fed into the synchronous mirror delay. The SMDOUT signal is input into the clock tree. If condition 2 is not satisfied 83, it is determined whether $t_{mdl}$ is equal to $t_{ck}$ in decision 80c. If so 82c, condition 3 84c is implicated, and lock has already occurred so a lock is declared and the synchronous mirror delay is bypassed. The CIN signal is input directly into the clock tree for internal production of the clock. If none of these conditions are true 85 and decision 80d is determined whether $t_{mdl}$ is equal to $t_{ck}/2$. If so 82d, condition 4 84d is implicated and it is merely necessary to invert the CIN signal or use an inverted CIN to be input into the clock tree. Again, since there is no need to further delay, the synchronous minor delay is bypassed and, in a preferred embodiment may be disabled in order to save power. The CIN' signal is input into the clock tree again to distribute the internal clock signal. The result of all four conditions 84a–84d is that lock 86 occurs with an overall reduction in delay stages, which is the purpose of the circuit while maintaining the desired operating range.

Figure 7:
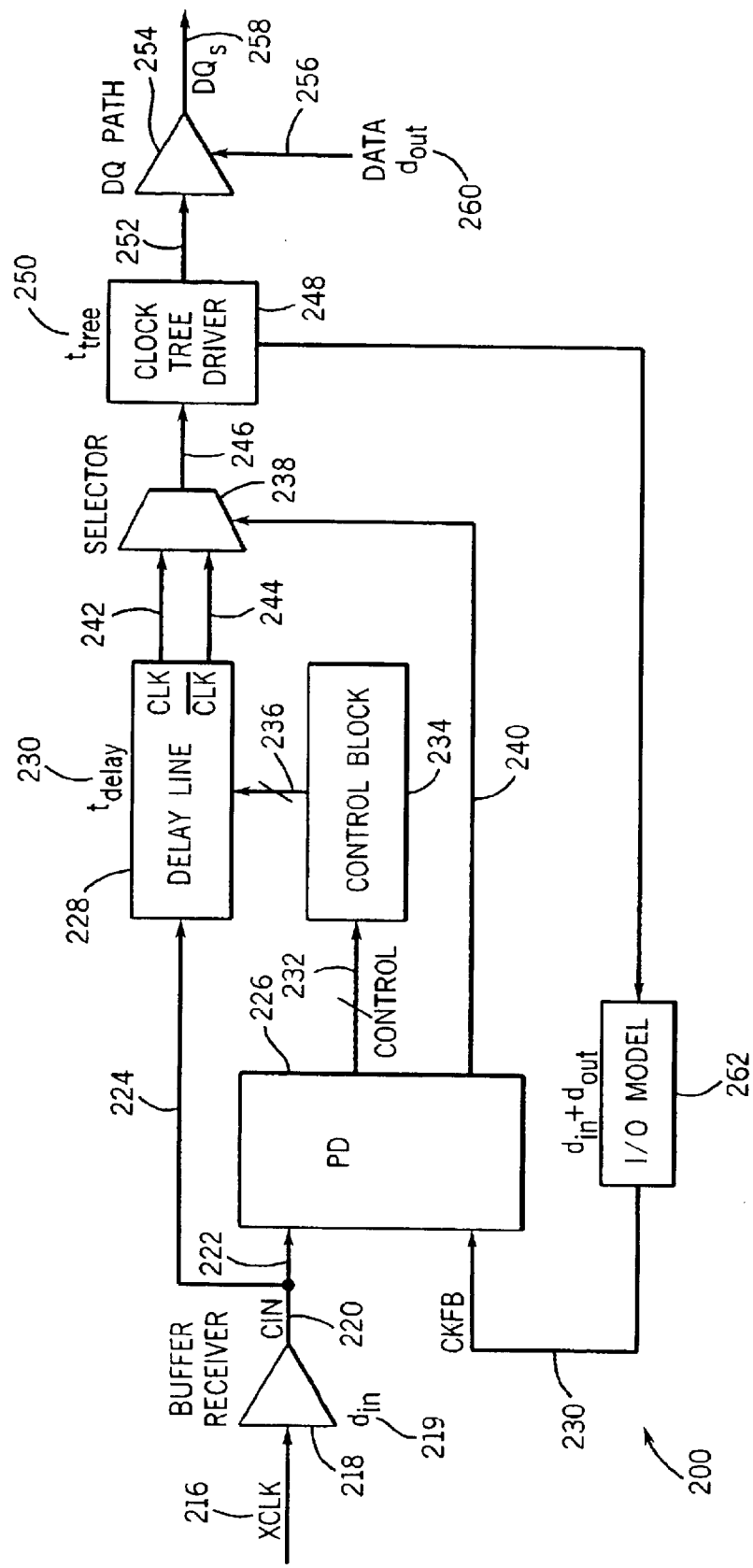
FIG. 7 is a block diagram of a delay-locked loop with phase detection in accordance with the present invention.

Referring now to FIG. 7, the present invention is shown being used in a delay-locked loop or DLL, which is shown generally by the numeral 200. An external clock signal 216 is input into receiver and buffer 218. This produces clock input signal (CIN) 220. The delay in the signal as it passes through buffer receiver 218 is represented by din 219. CIN signal 220 is input via branch 222 into phase detector 226. CIN signal 220 is also directed via branch 224 into delay line 228. Phase detector 226 may include any associated logical circuitry. The goal of the present invention is to take CIN signal 220 as well as a clock feedback signal 230 (CKFB) and, by defining particular characteristics and relationships about the timing of CIN signal 220 and CKFB 230, to delineate specific conditions under which the signals are operating, and selecting and directing the signals accordingly. Although a specific logic arrangement is shown, it is contemplated that any suitable control logic may be used to define the conditions of the signals and then selecting them accordingly. CKFB feedback signal 230 is a typical feedback loop as is found in a common delayed-lock loop (DLL). Phase detector 226 compares the timing of signal CIN and signal CKFB. Based on timing conditions and characteristics of each signal, control signals are sent via control lines 232 to control block 234 and output via lines 236 to delay line 228. The period of the delay is represented by $t_{delay}$ 230. Associated with the delay line 228 is selector 238 which receives an input 240 from the phase detector 226 as well as inputs 242 and 244 representative of the clock CLK and inverted clock signals respectively. Selector 238 selects, based on the input 240 from the phase detector 226, whether to put signal 242 or 244 to input 246 into clock tree driver 248. The period of delay by the driver is represented by $t_{tree}$ 250. The output 252 of the clock tree driver 248 is sent to an output buffer 254 which has an input data line 256 and a data output line 258. The delay by the output of data is represented by the parameter $d_{out}$ 260. Clock tree driver 248, as part of the delay-locked loop, feeds back into phase detector 226 via line 230. The delay associated with the I/O model 262 is represented by the parameter $d_{in}$ and $d_{out}$.

Generally speaking,

1. In order to synchronize XCLK with DQs, $$t_{delay} = t_{ck} - t_{tree} - (d_{in} + d_{out})$$

In traditional DLLs, the delay stages required are:

$$N = \frac{t_{delay}}{t_d} = \frac{t_{ck} - t_{tree} - (d_{in} + d_{out})}{t_d}$$

$$N_{worst} = \frac{t_{ck}(\text{long}) - t_{tree}(\text{short}) - (d_{in} + d_{out})(\text{fast})}{t_d(\text{fast})}$$

$$= \frac{15 \text{ n} - 1 \text{ n}}{110 \text{ ps}} \approx 128$$

2. Use same method, adding a selector $$t_e < t_{ck}/2, \; t_{delay} = t_{ck}/2 - t_e$$

$$t_e > t_{ck}/2, \; t_{delay} = t_{ck} - t_e$$

For both cases, $t_{delay}$ is less than or equal to $t_{ck}/2$ $$N_{worst} = \frac{t_{ck}/2(\text{long}) - \text{others}}{t_d(\text{fast})} = \frac{7.5 \text{ n} - 1 \text{ n}}{110 \text{ ps}} \approx 59$$

Figure 8:
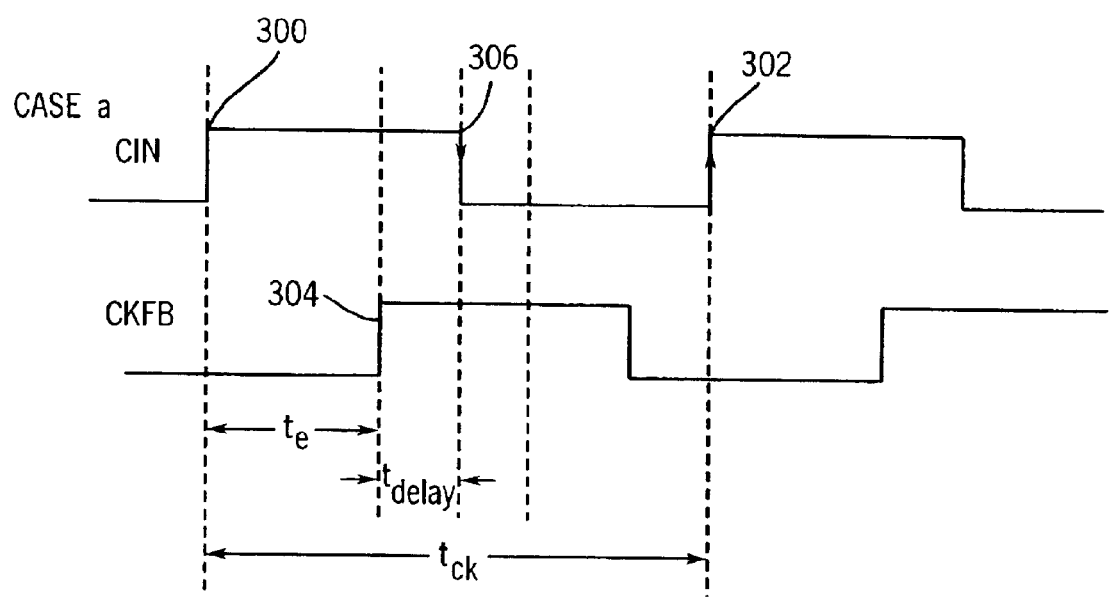
FIG. 8 is a signal timing diagram showing the timing of a clock input signal and a clock feedback signal in accordance with one aspect of the present invention.

Referring now to FIG. 8, a timing diagram for signals CIN and CKFB are shown in a particular arrangement. The period from the rising edge 300 to rising edge 302 is designated as $t_{ck}$. The amount of time from rising edge 300 of CIN and rising edge 304 of CKFB is represented by the parameter $t_c$. Additionally, the parameter from the rising edge 304 of CKFB and the falling edge 306 of CIN is represented by the parameter $t_{delay}$. In this case, $t_{delay}$ is less than or equal to half of $t_{ck}$.

Figure 9:
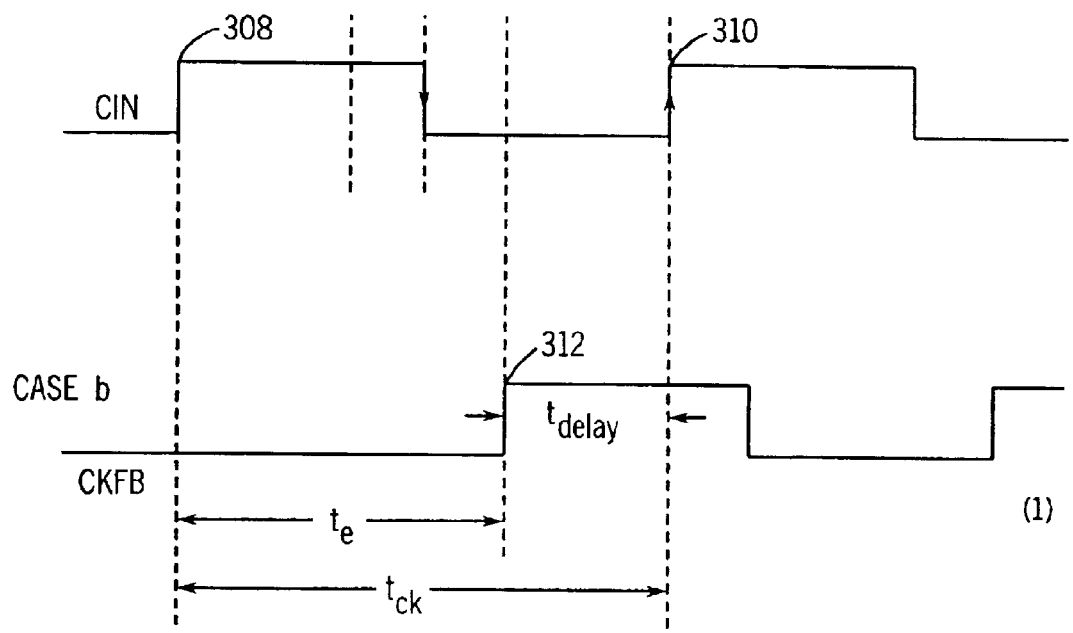
FIG. 9 is a signal timing diagram showing the timing of a clock input signal and a clock feedback signal in accordance with one aspect of the present invention.

Referring now to FIG. 9, the second case is illustrated where CKFB does not fire until after the first pulse of CIN. Again, $t_{ck}$ is represented by the rising edge 308 of CIN and the next rising edge 310 of CIN. Additionally, the length of time from the rising edge 308 to the rising edge 312 of CKFB is shown by the parameter $t_c$. However, in this instance, $t_{delay}$ is measured from the rising edge 312 of CKFB until the next rising edge 310 of CIN. Similarly, in this case, $t_{delay}$ is less than or equal to one-half of the clock period $t_{ck}$.

Figure 10:
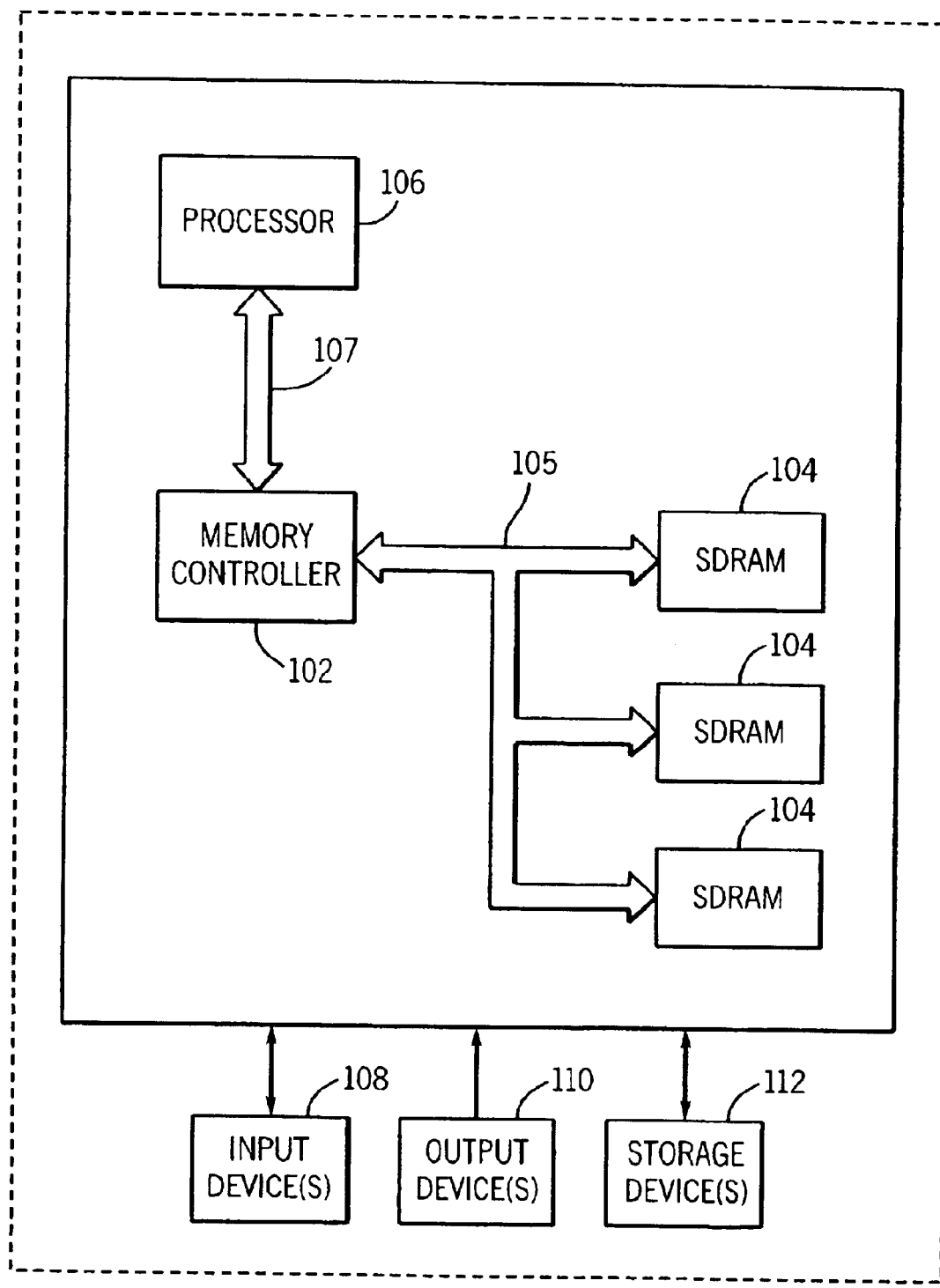
FIG. 10 is a block diagram illustrating a system in which the present invention may be used.

FIG. 10 is a block diagram of a computer system 100. The computer system 100 utilizes a memory controller 102 in communication with SDRAMs 104 through a bus 105. The memory controller 102 is also in communication with a processor 106 through a bus 107. The processor 106 can perform a plurality of functions based on information and data stored in the SDRAMs 104. One or more input devices 108, such as a keypad or a mouse, are connected to the processor 106 to allow an operator to manually input data, instructions, etc. One or more output devices 110 are provided to display or otherwise output data generated by the processor 106. Examples of output devices include printers and video display units. One or more data storage devices 112 may be coupled to the processor 106 to store data on, or retrieve information from, external storage media. Examples of storage devices 112 and storage media include drives that accept hard and floppy disks, tape cassettes, and CD read only memories.

While the present invention has been described in conjunction with preferred embodiments thereof, many modifications and variations will be apparent to those of ordinary skill in the art. For example, although the present invention is directed to synchronous mirror delay systems, the present invention is contemplated to be used with any implementable logic devices and in other arrangements, such as in a digital delay locked loop (DDLL), to improve the efficiency in that arrangement. The foregoing description and the following claims are intended to cover all such modifications and variations.

What is claimed is:

1. A method of improving the efficiency of synchronizing a clock signal for an integrated circuit, comprising:

providing a clock input signal (CIN), an inverted clock input signal (CIN'), and a clock delay signal (CDLY);

detecting a plurality of phases of CIN and CDLY based on timing conditions associated with CIN and CDLY; and selectively inputting CIN or CIN' into a synchronous mirror delay (SMD) based on the phase of CIN and CDLY to reduce a number of delay stages in the SMD.

2. The method of claim 1 wherein the timing conditions include a period of CIN ($t_{ck}$) and a period from arising edge in CIN to arising edge in CDLY ($t_{mdl}$), and selectively inputting includes inputting CIN into the SMD when $t_{mdl}>t_{ck}/2$ and inputting CIN' into the SMD when $t_{mdl}<t_{ck}/2$ to reduce the number of delay stages in the SMD.

3. The method of claim 2 wherein the number of delay stages in the SMD is reduced substantially in half.

4. The method of claim 2 wherein the SMD has a plurality of delay lines, and the number of delay stages in at least one of the SMD delay lines is reduced substantially to 59 from 128.

5. A method of improving the efficiency of synchronizing a clock signal for an integrated circuit, comprising:

providing a clock input signal (CIN), an inverted clock input signal (CIN'), and a clock delay signal (CDLY), each signal having timing characteristics;

interposing a phase detector and selection system between an external clock signal and a synchronous mirror delay (SMD);

determining which of a number of phases the signals are based on the timing characteristics; and selectively directing the signals based upon the phase of the signals.

6. The method of claim 5 wherein selectively directing includes selectively directing CIN or CIN' to the SMD based upon the timing characteristics of CIN and CDLY.

7. The method of claim 5 wherein selectively directing includes bypassing CIN or CIN' from the SMD based upon the timing characteristics of CIN and CDLY.

8. The method of claim 5 further including defining the timing characteristics as a period of CIN as $t_{ck}$ and defining a period from a rising edge in CIN to a rising edge in CDLY as $t_{mdl}$ and wherein determining includes determining that the phases include:

a first phase when $t_{mdl}>t_{ck}/2$;

a second phase when $t_{mdl}<t_{ck}/2$;

a third phase when $t_{mdl}=t_{ck}$;

a fourth phase when $t_{mdl}=t_{ck}/2$.

9. A method of synchronizing a clock signal for an integrated circuit, comprising:

providing an internal clock signal (CIN), an inverted internal clock signal (CIN'), and a clock delay signal (CDLY) having timing characteristics;

differentiating, with a phase detector, a plurality of phases based upon the timing characteristics of CIN and CDLY; and selecting, based on the phases, one of CIN and CIN' to be input into a synchronous mirror delay (SMD) thereby reducing a number of delay stages in the SMD.

10. A method of synchronizing a clock signal for an integrated circuit, comprising:

providing an internal clock signal (CIN), an inverted internal clock signal (CIN'), and a clock delay signal (CDLY) having timing characteristics;

determining a plurality of phases based upon the timing characteristics of CIN and CDLY; and for at least one phase, directing CIN' into a synchronous mirror delay (SMD) such that a reduced number of delay stages are achieved.

11. The method of claim 10 wherein the timing characteristics define a period of CIN as $t_{ck}$ and also define from a rising edge in CIN to a rising edge in CDLY as $t_{mdl}$, and directing occurs when $t_{mdl}<t_{ck}/2$.

12. A method of synchronizing a clack signal for an integrated circuit, comprising:

a) providing an internal clock signal (CIN), an inverted internal clock signal (CIN'), and a clock delay signal (CDLY) having timing characteristics;

b) determining a plurality of phases based upon the timing characteristics of CIN and CDLY;

c) for at least one phase, directing CIN' into a synchronous mirror delay (SMD) such that a reduced number of delay stages are achieved;

wherein the timing characteristics define a period of CIN as $t_{ck}$ and also define from a rising edge in CIN to a rising edge in CDLY as $t_{mdl}$, and directing occurs when $t_{mdl}<t_{ck}/2$;

d) multiplexing an input with an input selection multiplexer to select whether to direct the CIN or CIN' into the SMD, based on the phase determined in the determining step; and e) multiplexing, with an output selection multiplexer, an output of the input selection multiplexer with a SMD output, the output selection multiplexer selecting whether to output, based on the phase determined in the determining step, the SMD output or CIN bypassing the SMD, as an input to a clock tree to generate an internal clock signal.

13. A memory device comprising:

a synchronous mirror delay (SMD); and a phase detector control block in electronic communication with the SMD, wherein the phase detector control block receives a clock input signal (CIN), an inverted clock input signal (CIN'), and a clock delay signal (CDLY), the CIN and CDLY signal, each having timing characteristics the phase detector control block detects a plurality of conditions based on the timing characteristics of the CIN and CDLY signals and outputs a selected signal selected between the CIN and CIN' signals and the CDLY signal to the SMD, the timing characteristics of the CIN and CDLY signal are used to select the selected signal to the SMD to reduce a number of delay stages in the SMD for the selected signal passing through.

14. The memory device of claim 13 wherein the timing characteristics include a period of CIN defined as tck and a rising edge from CIN to a rising edge in CDLY is defined as tmdl; and a first phase is when $t_{mdl} > t_{ck}/2$;

wherein a second phase is when $t_{mdl} < t_{ck}/2$;

wherein a third phase is when $t_{mdl} = t_{ck}$; and wherein a fourth phase is when $t_{mdl} = t_{ck}/2$.

15. The memory device of claim 14 wherein when $t_{mdl} < t_{ck}/2$ the number of delay stages in the SMD is comparable to when $t_{mdl} < t_{ck}/2$.

16. The memory device of claim 14 wherein the number of delay stages when $t_{mdl} < t_{ck}/2$ is reduced by substantially one-half.

17. The memory device of claim 14 wherein the number of delay stages when $t_{mdl} < t_{ck}/2$ is reduced from 128 to substantially 59.

18. A synchronous mirror delay system comprising:

a synchronous mirror delay (SMD); and a phase detector control block in electronic communication with the SMD, wherein the phase detector control block receives a clock input signal (CIN), an inverted clock input signal (CIN'), and a clod delay signal (CDLY), the CIN and CDLY signals each having timing characteristics, the phase detector control block detects a plurality of conditions based on the timing characteristic of the CIN and CDLY signals, and outputs a selected signal selected between the CIN and CIN' signals and the CDLY signal to the SMD, the timing characteristics of the CIN and CDLY signals are used to select the selected signal to the SMD to reduce a number of delay stages in the SMD for the selected signal passing through, the timing characteristics define a period of CIN as $t_{mdl}$ and also define a period from a rising edge in CIN to a rising edge in CDLY as $t_{mdl}$, and plurality of conditions include:

a first phase when $t_{mdl} > t_{ck}/2$;

a second phase when $t_{mdl} < t_{ck}/2$ a third phase when $t_{mdl} = t_{ck}$; and a fourth phase when $t_{mdl} = t_{ck}/2$;

wherein the phase detector control block selects the selected signal such that the number of delay stages in the second phase is reduced and the selected signal is the CIN signal bypassing the SMD in the third and fourth phases.

19. A synchronizing circuit for use with an integrated circuit, comprising:

an input buffer far receiving an external clock signal to produce a clock input signal (CIN), an invert clock input signal (CIN'), and a clock delay signal (CDLY) each having timing character;

a synchronous mirror delay (SMD) having a measurement delay line input, a variable delay line input, and a variable delay line output; and a phase detector control block disposed between the input buffer and the SMD, the phase detector having a first input for receiving the CIN, a second input for receiving the CDLY and a third input for receiving the CIN' wherein the phase detector control block detects a plurality of conditions based on the timing characteristics of the CIN and CDLY signals, and outputs a selected signal selected between the CIN and CIN' signals to the variable delay line input and the CDLY signal to the measurement delay line input the timing characteristics of the CIN and CDLY signal are used to select the selected signal to the variable delay line input to reduce a number of delay stages in the SMD for the external block signal passing through.

20. The circuit of claim 19 wherein the timing characteristics define a period of CIN as $t_{ck}$ and also define a period from a rising edge in CIN to a rising edge in CDLY as $t_{mdl}$, and when $t_{mdl} < t_{ck}/2$, CIN' is input into the SMD and when $t_{mdl} > t_{ck}/2$ CIN is input into the SMD.

21. The circuit of claim 20 wherein the number of delay stages in the SMD when $t_{mdl} < t_{ck}/2$ is reduced.

22. The circuit of claim 20 wherein the number of delay stages in the SMD when $t_{mdl} < t_{ck}/2$ is reduced from 128 to substantially 59.

23. A system comprising:

a synchronous mirror delay (SMD); and a phase detector control block in electronic communication with the SMD, wherein the phase detector control block comprises a phase detector a logic circuit, and multiplexers wherein the phase detector control block receives a clock input signal (CIN), an inverted clock input signal (CIN'), and a clock delay signal (CDLY) the CIN and CDLY signals each having timing characteristics, the phase detector control block detects a plurality of conditions based an the timing characteristics of the CIN and CDLY signals, and outputs a selected signal selected between the CIN and CIN' signals and the CDLY signal to the SMD, the timing characteristics of the CIN and CDLY signals are used to select the selected signal to the SMD to reduce a number of delay stages in the SMD for the selected signal passing through.

24. The system of claim 23 wherein the timing characteristics include a period of CIN defined as $t_{ck}$ and a rising edge from CIN to a rising edge in CDLY is defined as $t_{mdl}$; and the phases include:

a first phase when $t_{mdl} > t_{ck}/2$; and a second phase when $t_{mdl} < t_{ck}/2$; and a third phase when $t_{mdl} = t_{ck}$; and a fourth phase when $t_{mdl} = t_{ck}/2$.

25. The system of claim 24 wherein the number of delay stages is induced.

26. The system of claim 24, wherein the number of delay stages is reduced substantially by one-half.

27. The system of claim 24 wherein the number of delay stages in the SMD when $t_{mdl} < t_{ck}/2$ is reduced from 128 to substantially 59.

28. A system comprising:

processor;

a memory controller;

a plurality of memory devices;

a first bus interconnecting the processor and memory controller;

a second bus interconnecting the memory controller and the plurality of memory devices;

each of the memory devices having:

a synchronous mirror delay (SMD); and a phase detector control block in electronic communication with the SMD, wherein the phase detector control block comprises a phase detector, a logic circuit, and multiplexers, wherein the phase detector control block receives a clack input signal (CIN) an inverted clock input signal (CIN'), and a clock delay signal (CDLY), the CIN and CDLY signals each having timing characteristics, the phase detector control block detects a plurality of conditions based on the timing characteristic of the CIN and CDLY signals, and outputs a selected signal selected between the CIN and CIN' signals and the CDLY signal to the SMD, the timing characteristics of the CIN and CDLY signals are used to select the selected signal to the SMD to reduce a number of delay stages in the SMD for the selected signal passing through.

* * * * *

UNITED STATES PATENT AND TRADEMARK OFFICE
CERTIFICATE OF CORRECTION

PATENT NO. : 6,798,259 B2
DATED : September 28, 2004
INVENTOR(S) : Feng Lin

It is certified that error appears in the above-identified patent and that said Letters Patent is hereby corrected as shown below:

Column 4,
Line 4, insert -- I/O -- before "system".

Column 6,
Line 38, delete "PD" and replace it with -- phase detector --.

Column 7,
Line 40, replace "din" with -- $d_{in}$ --.

Column 8,
Line 21, insert -- and -- before "adding".
Lines 39 and 48, replace "parameter $t_c$" with -- parameter $t_e$ --.

Column 9,
Line 28, replace "arising" with -- a rising --.
Line 63, after "$t_{mdl} = t_{ck}$;" insert -- and --.

Column 10,
Line 60, replace "CDLY signal" with -- CDLY signals --.
Line 65. replaec "tck" with -- $t_{ck}$ --.
Line 67, replace "tmdl" with -- $t_{mdl}$ --.

Column 11,
Lines 2-4, delete each occurrence of "wherein".
Line 19, replace "clod" with -- clock --.
Line 23, replace "characteristic" with -- characteristics --.
Line 30, replace "CIN as $t_{mdl}$" with -- CIN as $t_{ck}$ --.
Line 46, replace "invert" with -- inverted --.
Line 48, replace "character" with -- characteristics --.
Line 61, replace "CDLY signal" with -- CDLY signals --.
Line 64, replace "block" with -- clock --.

UNITED STATES PATENT AND TRADEMARK OFFICE
CERTIFICATE OF CORRECTION

PATENT NO. : 6,798,259 B2
DATED : September 28, 2004
INVENTOR(S) : Feng Lin

It is certified that error appears in the above-identified patent and that said Letters Patent is hereby corrected as shown below:

Column 12,
Line 17, replace "based an" with -- based on --.
Line 34, replace "induced" with -- reduced --.
Line 54, replace "clack" with -- clock --.
Line 59, replace "timing characteristic" with -- timing characteristics --.

Signed and Sealed this

Twenty-fifth Day of January, 2005

JON W. DUDAS
*Director of the United States Patent and Trademark Office*